(12) United States Patent
La Rosa et al.

(10) Patent No.: US 12,057,180 B2
(45) Date of Patent: Aug. 6, 2024

(54) NON-VOLATILE MEMORY DEVICE WITH IMPROVED CELL CYCLING AND CORRESPONDING METHOD FOR OPERATING THE NON-VOLATILE MEMORY DEVICE

(71) Applicants: STMicroelectronics S.r.l., Agrate Brianza (IT); STMicroelectronics (Rousset) SAS, Rousset (FR)

(72) Inventors: Francesco La Rosa, Rousset (FR); Antonino Conte, Tremestieri Etneo (IT); Francois Maugain, Trets (FR)

(73) Assignees: STMicroelectronics S.r.l., Agrate Brianza (FR); STMicroelectronics (Rousset) SAS, Rousset (FR)

( * ) Notice: Subject to any disclaimer, the term of this patent is extended or adjusted under 35 U.S.C. 154(b) by 155 days.

(21) Appl. No.: 17/934,102

(22) Filed: Sep. 21, 2022

(65) Prior Publication Data
US 2023/0091464 A1 Mar. 23, 2023

(30) Foreign Application Priority Data
Sep. 22, 2021 (IT) .......................... 102021000024374

(51) Int. Cl.
*G11C 16/00* (2006.01)
*G11C 16/14* (2006.01)
(Continued)

(52) U.S. Cl.
CPC .......... *G11C 16/3445* (2013.01); *G11C 16/14* (2013.01); *G11C 16/26* (2013.01);
(Continued)

(58) Field of Classification Search
CPC ..... G11C 16/16; G11C 16/3445; G11C 16/26; G11C 16/14; G11C 29/50004; G11C 16/3404; G11C 16/3468; G11C 16/04; G11C 16/344; G11C 29/02; G11C 29/021; G11C 29/028; G11C 16/30; G11C 16/349; G11C 16/0408; G11C 16/0466; G11C 11/5628; G11C 11/5642; G11C 16/0425; G11C 16/0433; G11C 16/10; G11C 16/28; G11C 16/3418; G11C 16/3454; G11C 2029/0405; G11C 2029/0409; G11C 2029/4402; G11C 2029/5002;
(Continued)

(56) References Cited

U.S. PATENT DOCUMENTS 9,728,268 B1 8/2017 Takizawa et al.
10,140,040 B1 11/2018 Koudele et al.
(Continued)

*Primary Examiner* — Thong Q Le
(74) *Attorney, Agent, or Firm* — Slater Matsil, LLP

(57) ABSTRACT

In an embodiment a non-volatile memory device includes a memory array having a plurality of memory cells, a control unit operatively coupled to the memory array, a biasing stage controllable by the control unit and configured to apply a biasing configuration to the memory cells to perform a memory operation and a reading stage coupled to the memory array and controllable by the control unit, the reading stage configured to verify whether the memory operation has been successful based on a verify level, wherein the control unit is configured to adaptively modify a value of the verify level based on an ageing of the memory cells.

20 Claims, 6 Drawing Sheets

(51) Int. Cl.
   *G11C 16/26*    (2006.01)
   *G11C 16/34*    (2006.01)
   *H10B 41/30*    (2023.01)
   *H10B 41/40*    (2023.01)

(52) U.S. Cl.
   CPC ........ *G11C 16/3459* (2013.01); *G11C 16/349* (2013.01); *H10B 41/30* (2023.02); *H10B 41/40* (2023.02)

(58) Field of Classification Search
   CPC .... G11C 2029/5004; G11C 2029/5006; G11C 29/04; G11C 29/06; G11C 29/24; G11C 29/4401; G11C 16/3459; G11C 16/3495; G11C 2029/0403; G11C 29/50016
   USPC ..... 365/185.29, 185.18, 185.22, 185.24, 218
   See application file for complete search history.

(56) References Cited

U.S. PATENT DOCUMENTS 10,147,490 B2 * 12/2018 Grande ................. G11C 16/16
2013/0176784 A1    7/2013 Cometti et al.

\* cited by examiner

NON-VOLATILE MEMORY DEVICE WITH IMPROVED CELL CYCLING AND CORRESPONDING METHOD FOR OPERATING THE NON-VOLATILE MEMORY DEVICE

CROSS-REFERENCE TO RELATED APPLICATIONS

This application claims the benefit of Italian Application No. 102021000024374, filed on Sep. 22, 2021, which application is hereby incorporated herein by reference.

TECHNICAL FIELD

The present solution relates to a non-volatile memory device with improved cell cycling and to a corresponding method for operating the non-volatile memory device.

BACKGROUND

The following description will make reference, without this implying any loss of generality, to a non-volatile memory device to be erased through the Fowler-Nordheim (FN) tunnelling effect, such as a memory device of a flash, page-flash, or e-STM (embedded Select Trench Memory) type.

As known, and as shown schematically in FIG. 1, a memory cell 1, of the floating-gate type, of a non-volatile memory device, for example of a flash type, generally comprises: a bulk region 2, for example with a p-type doping, provided in a substrate 3 of semiconductor material, for example silicon; a source region 4 and a drain region 5, for example with a n-type doping, provided within a surface portion of the bulk region 2; a floating-gate region 6, arranged above the bulk region 2 and separated from the same bulk region 2 by a tunnel-oxide region 7; and a control-gate region 8, arranged above the floating-gate region 6 and separated therefrom by an intermediate oxide (the so-called "ONO") region 9.

For storing information, electric charges are injected from the substrate 3 into the floating-gate region 6 (program operation), thus varying the threshold of the memory cell 1, i.e., the voltage to be applied between the control-gate region 8 and the source region 4 to switch-on the memory cell 1 and obtain conduction of electric current between the source region 4 and the drain region 5.

The reading operation, upon application of an appropriate biasing voltage to the control-gate region 8, detects the conduction characteristic of the memory cell 1, from which it is possible to obtain the stored information.

The erase operation for erasing the information envisages removal of the electric charge stored in the floating-gate region 6, via electron extraction. In particular, this operation requires (as illustrated in FIG. 1) application of a high electrical field between the bulk region 2, which is brought to a high positive value voltage (for example +10 V), and the control-gate region 8, which is brought to a high negative value voltage (for example −10 V). In a known manner, the high electrical field generated is sufficient to trigger the FN tunnelling effect causing movement of the electrons, which migrate from the floating-gate region 6 through the tunnel-oxide region 7 (once again, as illustrated schematically in FIG. 1).

In particular, the memory operations, e.g. the erase operations, are generally carried out simultaneously on a group or set of memory cells 1, belonging for example to a same block, sector, or page, of the non-volatile memory device, these cells being thus erased together in a same erase operation.

Evidently, the erase process is effective only if the applied electrical field has a value sufficient to trigger the FN tunnelling effect.

In a known manner, in order to check the correctness of the memory operations being performed (programming or erasing), a reading (verify) operation is carried out after each memory operation to verify that proper erasing or programming has been carried out.

As schematically shown in FIG. 2, a verify operation involves reading the memory cell content, applying a verify reading voltage $V_{read}$ to the control-gate region 8 of the same memory cell 1 and reading the value of the current flowing in the memory cell to check the conduction characteristic thereof (the current value being associated with the threshold voltage value).

A programming operation is considered successful if the distribution of the voltage threshold $V_{TH}$ (shown in the same FIG. 2, where the number of memory cells 1 is shown in the y axis) is higher than a programming verify voltage level (PV), having a predetermined value; likewise, erase operation is considered successful if the voltage threshold ($V_{TH}$) distribution (also shown in the same FIG. 2) is lower than a erase verify voltage level (EV), also having a predetermined value.

As shown in FIG. 2, the value of the verify reading voltage $V_{read}$ is intermediate between the erase verify voltage level EV (having a negative value) and the programming verify voltage level PV (having a positive value); for example, the verify reading voltage $V_{read}$ has a value around 0V.

In a known manner, NVM cells are aged due to cycling (i.e. the repetition of program/erase cycles undergone by the same memory cells 1); in particular, ageing creates traps in the cell oxide, which can trap/release electrons (effect known as "trapping"/"de-trapping").

Electron trapping/de-trapping determines a cell threshold shift over time; this shift is activated by an electric field and a high temperature. The phenomenon of trap generation is progressively worsened by cycling (i.e. cell ageing).

In particular, FIGS. 3A and 3B show the shift of the cell threshold voltage $V_{TH}$ after a baking operation (i.e. a high-temperature data retention test) compared to the value of the same threshold voltage $V_{TH}$ before baking, respectively in the case of "fresh" memory cells (FIG. 3A) and aged or "heavily cycled" memory cells (FIG. 3B).

In both cases, baking (and the associated high temperatures involved) determines a shift of the threshold voltage $V_{TH}$, whose absolute values decrease (both in the cases of programmed and erased memory cells); this shift is evidently higher for aged cells, whose threshold voltage distribution experiences a larger shift towards the reading voltage level $V_{read}$.

As shown in the same FIGS. 3A and 3B, erase verify (EV) and program verify (PV) levels have thus to be set taking into account the maximum level of trapping/de-trapping on aged cells, so that data retention may still be guaranteed. This leads however to over-programming or over-erasing of memory cells when they are fresh or slightly aged, accelerating ageing (as it is known, ageing is linked to the quantity of charge flowing in the tunnel oxide).

SUMMARY

Embodiments provide an improved cell cycling solution in non-volatile memory devices, allowing to overcome, at least in part, the above discussed issue.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 1:
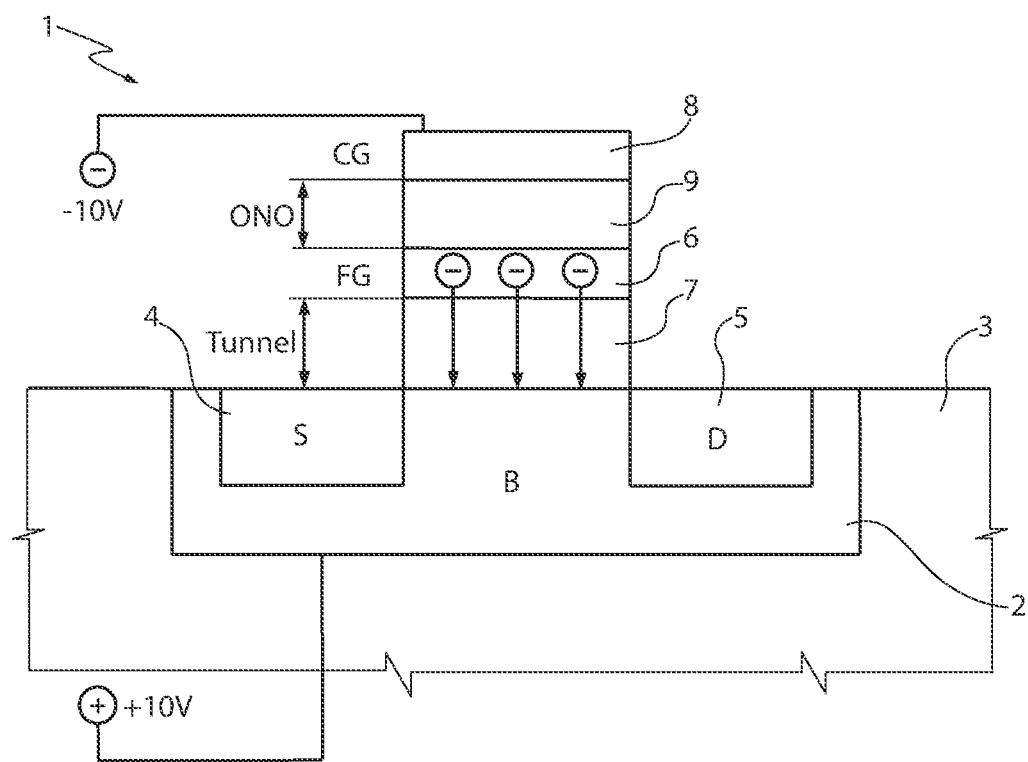
FIG. 1 is a schematic cross-section of a memory cell of a known type non-volatile memory device.
Figure 2:
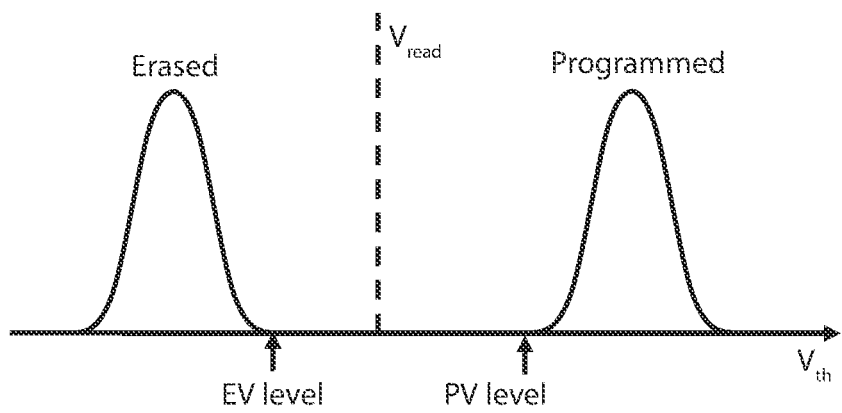
FIG. 2 is threshold voltage level distributions in the non-volatile memory device, for programmed and erased memory cells.
Figure 3A:
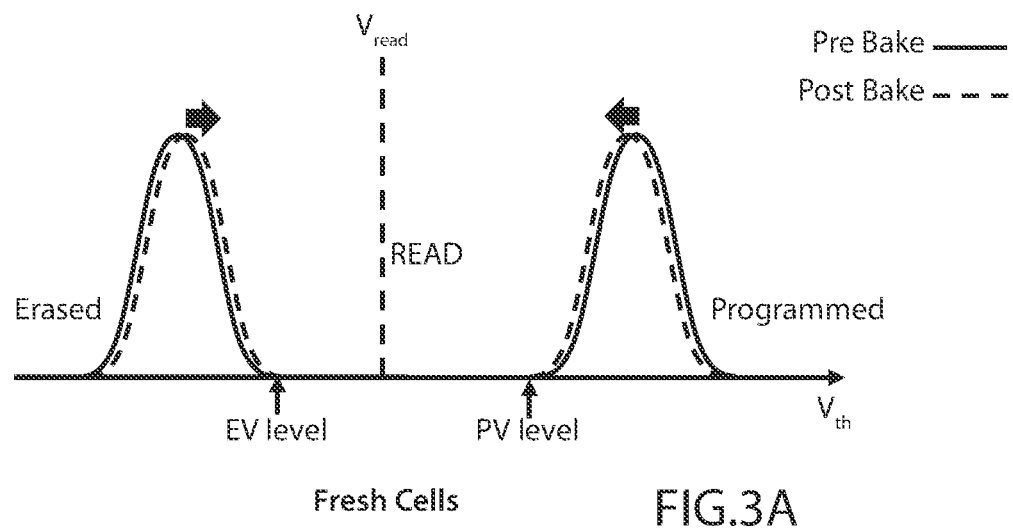
FIGS. 3A-3B are shifts in the threshold voltage level distributions for fresh and aged memory cells.
Figure 3B:
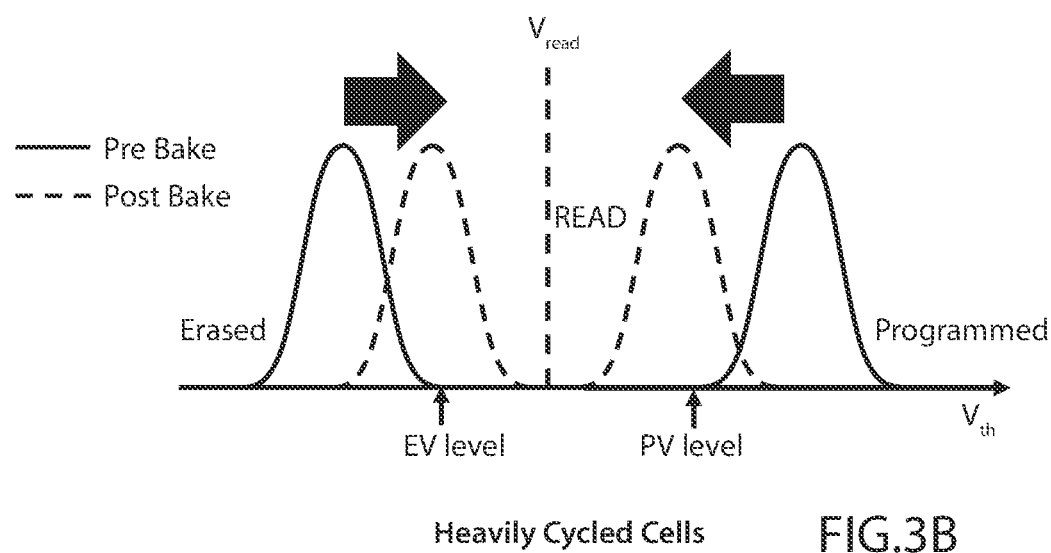
Figure 4:
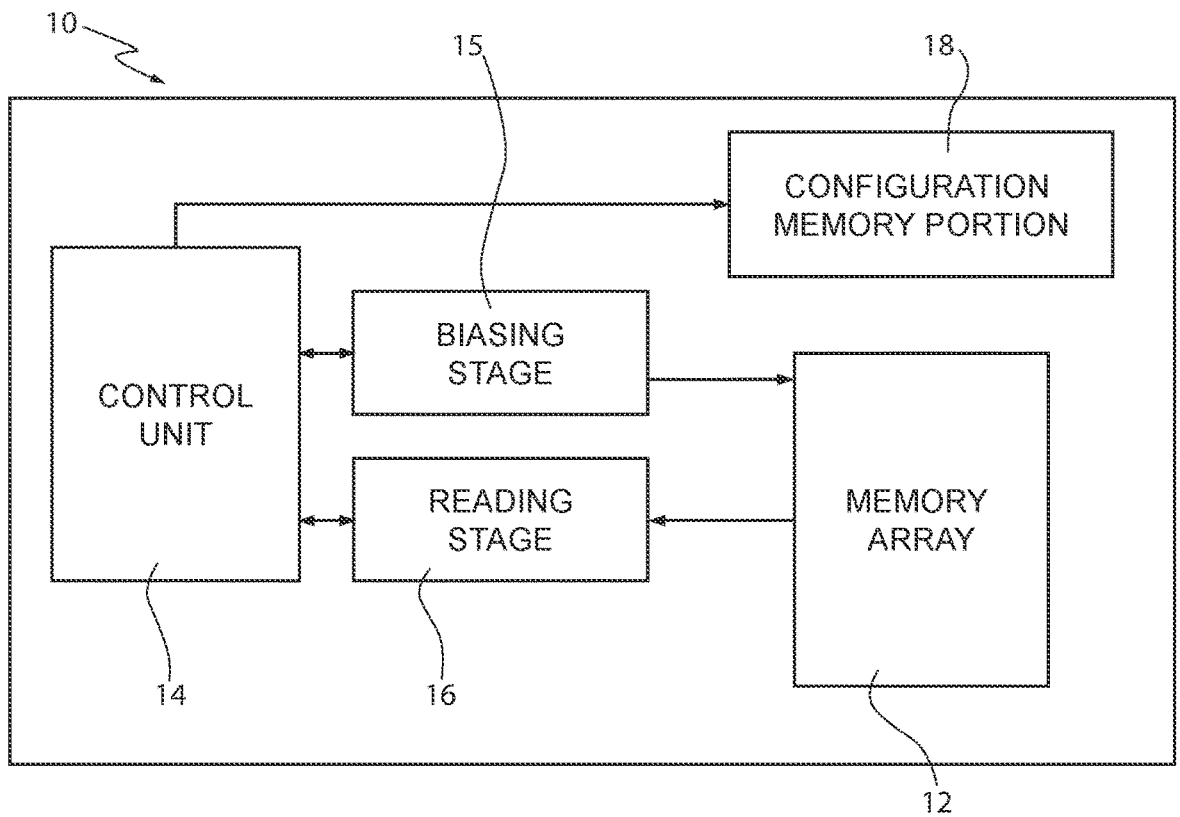
FIG. 4 is a general block diagram of a non-volatile memory device.

With initial reference to FIG. 4, a memory device 10, of a non-volatile type, for example of a flash or page-flash type, generally comprises a memory array 12, including a plurality of memory cells 1, of the floating-gate type (for example, as described with reference to FIG. 1), arranged in rows (word lines) and columns (bit lines) and operatively grouped together in groups (for example, sectors or pages). In particular, a memory operation, for example an erase operation for erasing the information stored in the memory cells 1 is carried out in the memory device 10 simultaneously for all the memory cells 1 belonging to a same group (for example, sector or page).

The memory device 10 further comprises a control unit 14, for example, including a microprocessor or microcontroller, which is operatively associated with the memory array 12 and is designed to control operation thereof and in particular to control execution of the memory operations of programming, erasing, reading, including the verify operation.

The memory device 10 further comprises: a biasing stage 15, controlled by the control unit 14 for supplying appropriate biasing signals to the memory cells 1 of the memory array 12 during the memory operations; and a reading stage 16, which is also controlled by the control unit 14, for carrying out reading of the contents of the memory cells 1 (in particular, for verifying correct erasure during the erase operation or correct programming during programming operations).

The memory device 10 further comprises a configuration memory portion 18, managed by the control unit 14 and which is not accessible to the user of the memory device 10 for memory operations. Configuration information of the memory device 10 are, in general, stored in this configuration memory portion 18.

As will be discussed in detail in the following, considering that the memory cells 1 of a group (e.g. sector, page or row) of a non-volatile memory device are aged in a corresponding manner, an aspect of the present solution envisages implementing a dynamic adaptation (or modulation) of the erase and programming verify (EV and PV) levels based on, or as a function of, ageing of the memory cells 1. In particular, the control unit 14 is configured to modify the verify level values as a function of an information indicative of ageing of the memory cells 1.

Figure 5:
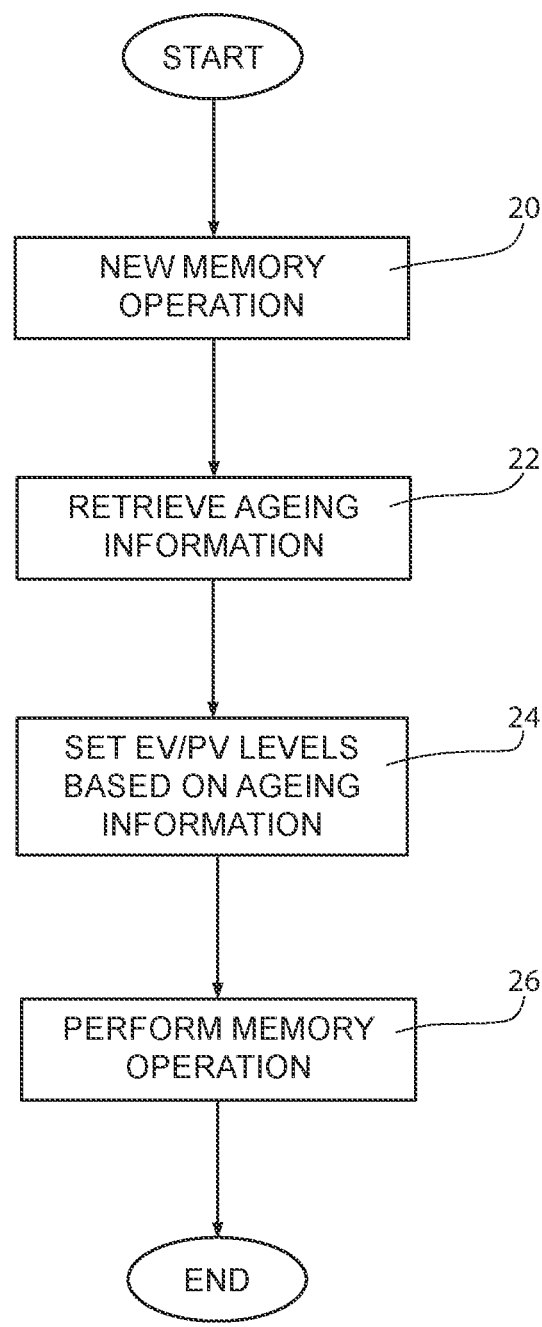
FIGS. 5 and 6 are flowcharts regarding operations carried out by the method according to embodiments.

As schematically shown in FIG. 5, the control unit 14 may therefore be configured (step 20) to determine the need to carry out a new memory operation (for example, a programming operation or an erase operation) that envisages verifying the correctness and effectiveness of the same memory operation.

The control unit 14 is then configured to: retrieve (step 22), e.g. from the configuration memory portion 18, stored ageing information indicative of ageing of the memory device 10 and the related memory cells 1; and adaptively modify (step 24) the erase verify level EV and/or the programming verify level PV based on the stored ageing information, in particular as a function of the same stored ageing information.

In a possible implementation, a look-up table may be implemented, associating suitable values of the erase verify level EV and/or the programming verify level PV with corresponding values for the ageing information (the verify levels being determined e.g. in a design or testing phase). As an alternative, a function may be implemented in order to compute the erase verify level EV and/or the programming verify level PV based on the same ageing information. For example, a possible function may envisage a linear proportionality between a variation associated with the ageing information and a corresponding variation of the verify levels.

The control unit 14 is then configured to perform the memory operation using the dynamically adapted erase verify level EV and/or the programming verify level PV, as shown at step 26, in order to verify its correctness.

It is noted that, as an alternative or in addition, dynamic adaptation of the erase verify level EV and/or the programming verify level PV based on the stored ageing information could also be implemented by the control unit 14 at certain triggered times or at preset intervals during the life of the memory device 10.

According to an embodiment of the present solution, ageing of the memory cells (and therefore the stored ageing information) are determined based on information associated with an operating configuration (in particular a biasing configuration) that allowed a previous memory operation to be performed correctly. In particular, this information may include a biasing voltage level required to erase the memory cells 1 of a same group; indeed, the more a page is aged, the higher the erase voltage required to erase the corresponding memory cells 1.

In particular, a known solution, disclosed e.g. in U.S. Pat. No. 10,147,490, envisages storing information associated with an operating configuration (e.g. a biasing configuration) that allowed a previous or past memory operation to be performed correctly, and using this information for restoring the same operating configuration as the starting point for a subsequent memory operation. This stored information may concern the last configuration used, or else one or more of the previous configurations, for example the next-to-last one and/or the second-to-last one.

In particular, the erase operation on a set (sector or page) of memory cells 1 envisages iterative application of a certain number of pulses, of increasing voltage values and of a fixed duration, each followed by a verify operation for verifying that the erase has been successful. The application of the erase pulses is interrupted as soon as the verify operation determines that the erase has been correctly performed.

For example, pulses of increasing value of the bulk voltage $V_{pp}$ are applied, with the control-gate region 8 negatively biased (i.e., set at a voltage $V_{CG}$ of a high negative value, for example −10 V). The pulses of the bulk voltage $V_{pp}$ may start from a minimum value $V_{pp\_min}$, determined in the design or characterization stage of the non-volatile memory device, and increase, e.g. with constant steps, up to a maximum value $V_{pp\_max}$, which may also be determined during design or characterization of the memory device.

Between successive pulses, a verify step, through a reading operation, is implemented to verify that the erase has been successful. If the verification does not yield a positive result, a subsequent pulse is iteratively applied with an incremented value; otherwise, when it is verified that the erase has been successful (i.e., when it is verified that the value of electrical field required for activation of the FN tunneling effect has been reached or crossed) the process ends.

According to the solution disclosed in U.S. Pat. No. 10,147,490, the first step of the iterative process for a subsequent memory operation implements a previous configuration (found to be successful during a previous erase operation), to avoid application of all the preceding pulses (and the consequent degradation of the memory cells).

Figure 6:
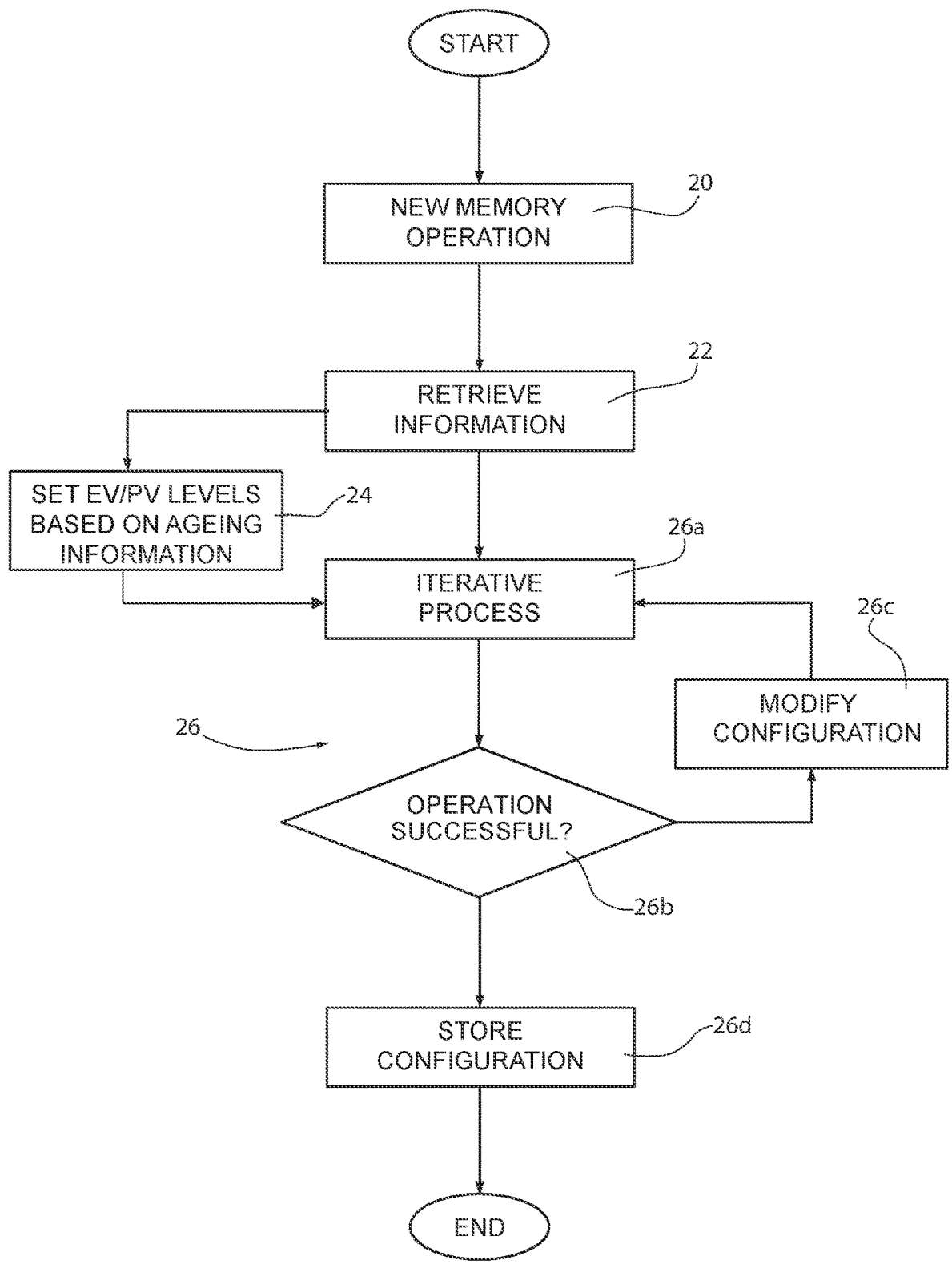

According to a possible embodiment, and as shown schematically in FIG. 6, the control unit 14 may therefore be configured at step 20 to determine whether it is required to carry out a new memory operation (for example, the aforesaid erase operation) that envisages an iterative application of a biasing configuration (for example, including an appropriate value of the aforesaid bulk voltage $V_{pp}$) to a set of memory cells 1, and verification of effective execution of the desired operation (for example, erase of the same memory cells 1). At each new step of the iterative process, which is carried out, if the verify operation yields a negative result, the control unit 14 determines a new biasing configuration for a new execution of the memory operation.

As mentioned previously, the control unit 14 is in this case configured to store information associated with the biasing configuration that has been verified as being effective during a past memory operation performed on a set of memory cells 1. The control unit 14 stores this information, for example within the configuration memory portion 18 of the memory device 10, in combination with the specific set of memory cells 1 on which the past memory operation has been carried out.

When it is required to perform a new memory operation on the same set of memory cells 1, the control unit 14 retrieves, from the configuration memory portion 18, the stored information associated with the biasing configuration, and uses this same biasing configuration in a first step of the iterative process that is then implemented for carrying out the new memory operation (as shown at step 26a). It is noted that the same stored information defines the above discussed ageing information used to set the erase and programming verify levels EV, PV (at step 24).

At the end of each step of the iterative process, the control unit 14 verifies (step 26b) whether the memory operation has been successful: if it has not been successful, the control unit 14 determines a new step of the iterative process, determining in particular a modification (step 26c) of the biasing configuration (for example, an increment in the level of the aforesaid bulk voltage $V_{pp}$); otherwise, if it has been successful (step 26d), the control unit ends the iterative process and stores within the configuration memory portion 18 the new biasing configuration that has been determined as being effective, in combination with the aforesaid set of memory cells 1.

In greater detail, and with reference to an erase operation of the data stored in a set of memory cells 1, the biasing stage 15 may comprise a digital-to-analog converter (DAC), which receives a digital control signal DAC_IN from the control unit 14 and generates accordingly the pulsed bulk voltage $V_{pp}$, the level of which corresponds to the digital control signal received.

The iterative algorithm may envisage generation, in consecutive steps, of pulses of increasing value (each of which with an incremented value of the digital control signal DAC_IN), until the level of the actual pulse of the bulk voltage $V_{pp}$ reaches or exceeds the threshold for triggering of the FN tunneling effect. The control unit 14 then stores information associated with the actual biasing configuration, for example the actual level of the bulk voltage $V_{pp}$, or, likewise, the last value of the digital control signal DAC_IN, within the configuration memory portion 18 (and/or a number of previous values thereof, previous to the last one).

At a new erase operation on the same set of memory cells 1, the control unit retrieves from the configuration memory portion 18 the previously stored information (in the example, the level of the bulk voltage $V_{pp}$, or the last value of the digital control signal DAC_IN) so as to determine the biasing configuration of the first step of the iterative process according to the information retrieved.

Again, it is noted that the same stored information (in the example, the last level of the bulk voltage $V_{pp}$, or the last value of the digital control signal DAC_IN) is used according to the present solution to set the erase and programming verify levels EV, PV in a manner that is dynamically adapted to the ageing of the memory cells 1.

Figure 7:
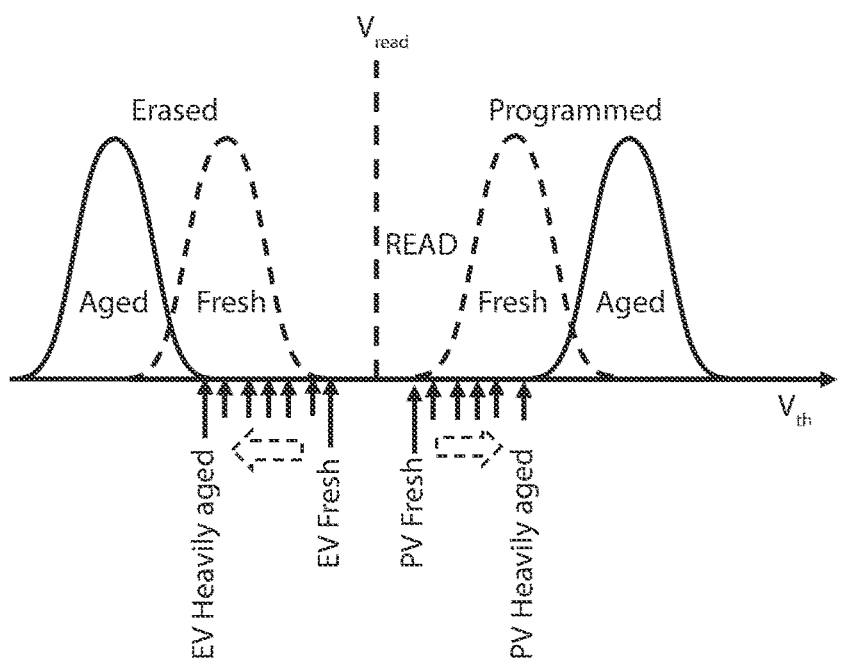
FIG. 7 shows the threshold voltage level distributions for fresh and aged memory cells, with dynamically adapted erase and programming verify levels, according to embodiments.

FIG. 7 is an exemplary representation of the threshold voltage distribution for fresh and heavily cycled (aged) memory cells 1. As shown, according to the present solution, the programming and erase verify levels PV, EV are modified to dynamically adapt to ageing of the memory cells, starting from a minimum value, $PV_{fresh}$, $EV_{fresh}$, which corresponds to the fresh cells and has a minimum absolute value (and is therefore closer to the verify reading voltage $V_{read}$) to a maximum value, $PV_{cycled}$, $EV_{cycled}$, which corresponds to the heavily aged cells and has a maximum absolute value (and is therefore farther away to the verify reading voltage $V_{read}$).

For example, as shown in the same FIG. 7, the programming and erase verify levels PV, EV are modified at increasing steps from the minimum to the maximum value.

Figure 8:
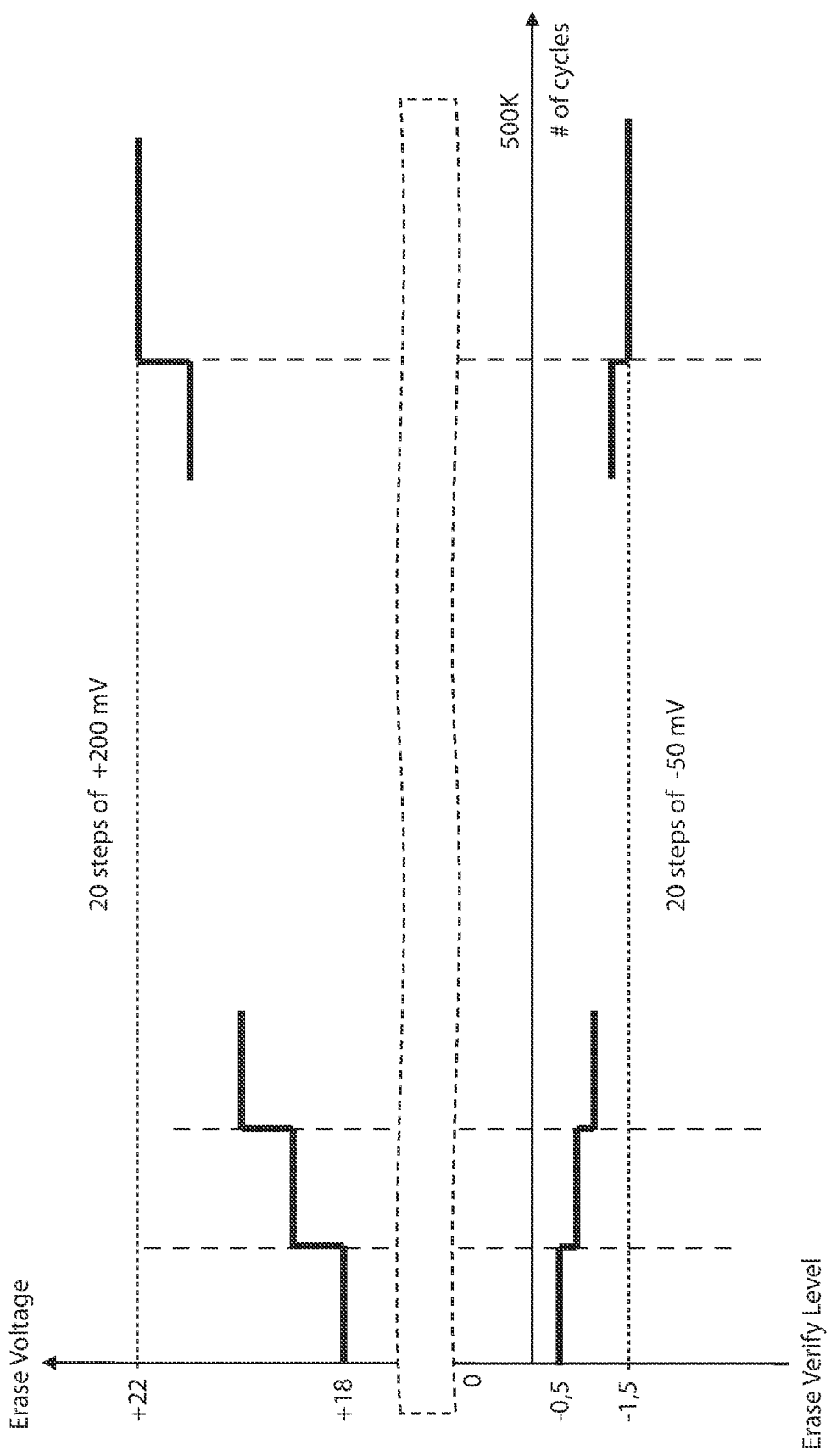
FIG. 8 shows diagrams related to dynamically adapted erase verify levels, corresponding to erase biasing voltage levels, according to embodiments.

FIG. 8 shows a possible implementation example, wherein the modification of the erase verify levels EV is implemented with 20 steps of a constant value (−50 mV), to correspond to a matching variation of the erase voltage value (with 20 steps of a value of 200 mV). In the example, the last configuration for the erase verify level EV and erase voltage is reached after 500 k of operating cycles of the memory cells 1.

It is clear, however, that the step variation of the erase verify level EV may not match that of the erase biasing voltage; for example, a single step of variation of the erase verify level EV could correspond to four steps of variation of the erase biasing voltage. Moreover, the variation steps could not be constant, but variable as the ageing of the memory cells 1 progresses (in general, various pattern of variations of the erase verify level EV can be envisaged, based on the variation of the erase biasing voltage).

The advantages of the present solution emerge clearly from the foregoing description.

In any case, it is once again underlined that the discussed solution allows optimization of memory cells ageing, improving cycling capability and data retention endurance, for an overall improvement of efficiency and reliability of the non-volatile memory device 10.

The implementation of the solution is also simple and with negligible added cost with respect to standard, known devices.

In general, the solution proposed may thus advantageously be applied to memory devices in apparatuses with high safety levels (in the sectors of telecommunications, pay-TV, field banking, etc.), in microcontrollers (for domotic applications, for radiofrequency applications, for display apparatuses), or in general in the automotive field.

Finally, it is clear that modifications and variations may be made to what has been described and illustrated herein, without thereby departing from the scope of the present invention, as defined in the annexed claims.

In particular, it is underlined that the present solution may be applied to any non-volatile memory devices, which requires verification of the memory operations.

It is again underlined that, in case of the erase operation described previously, the control unit 14 may store, instead of the last level of the bulk voltage $V_{pp}$ that has led to effective erase of the memory cells 1, one or more of the previous levels (for example, the next-to-last level or the second-to-last level) and/or the corresponding value of the digital control signal DAC_IN for the biasing stage 15. This may be advantageous in the case where, between one memory operation and the next, variations of the operating conditions may occur, for example temperature variations, which could vary the level required for activation of the FN tunnelling effect. In this case, in fact, starting the iterative process from one or more previous configurations allows compensation for this variation.

Moreover, the same information stored may be of a different type, provided that it represents the last biasing configuration used for the memory operation. For example, in the case of the erase operation on the memory cells 1, as an alternative, or in addition, to the level of the pulses of the bulk voltage $V_{pp}$, a duration of the pulses (if the same duration is variable), or else the incremental number of the pulses (if both the duration and the incremental step between successive pulses are constant) could be stored (also representing the above discussed ageing information).

It is also emphasized that the solution described may use in general any information indicative of ageing of the memory cells 1, which may be associated e.g. with any memory operation that may be optimized on the basis of the knowledge of the configuration of the previous memory operation carried out on the same memory cells.

What is claimed is:

1. A non-volatile memory device comprising:
a memory array having a plurality of memory cells;
a control unit operatively coupled to the memory array;
a biasing stage controllable by the control unit and configured to apply a biasing configuration to the memory cells to perform a memory operation; and
a reading stage coupled to the memory array and controllable by the control unit, the reading stage configured to verify whether the memory operation has been successful based on a verify level,
wherein the control unit is configured to adaptively modify a value of the verify level based on an ageing of the memory cells.

2. The device according to claim 1, wherein the control unit is configured to control whether the memory operation has been successful using an adaptively modified verify level.

3. The device according to claim 1, wherein the control unit is configured to adaptively modify the value of the verify level based on ageing information indicative of the ageing of the memory cells.

4. The device according to claim 3, wherein the control unit is configured to retrieve the ageing information indicative of the ageing of the memory device from a configuration memory of the memory device.

5. The device according to claim 4, wherein the control unit is configured to determine the adaptively modified value of the verify level using a look-up table, and wherein values of the verify level are stored in association with respective values for the ageing information.

6. The device according to claim 5, wherein the ageing information is associated with the biasing configuration provided by the biasing stage that has allowed to successfully perform one or more previous memory operations.

7. The device according to claim 4, wherein the control unit is configured to determine the adaptively modified value of the verify level using a function to compute the verify level based on the ageing information.

8. The device according to claim 7, wherein the ageing information is associated with the biasing configuration provided by the biasing stage that has allowed to successfully perform one or more previous memory operations.

9. The device according to claim 1, wherein the memory cells are of a floating-gate type, each including a bulk region and a control-gate region, wherein the memory operations include an operation of erase of the memory cells, and the biasing configuration includes a voltage applicable between the control-gate region and the bulk region of the memory cells.

10. The device according to claim 1, wherein the control unit is configured to:
control the biasing stage to perform a first successful execution of the memory operation on a group of memory cells by applying a first biasing configuration;
store information associated with the first biasing configuration; and
control the biasing stage to perform a second execution, subsequent to the first execution of the memory operation on the same group of memory cells by applying a second biasing configuration determined according to the stored information associated with the first biasing configuration,
wherein the information associated with the first biasing configuration corresponds to ageing information.

11. The device according to claim 1, wherein the verify level includes one or both of an erase verify level to verify an erase memory operation and a programming verify level to verify a programming memory operation.

12. A method for operating a non-volatile memory device, wherein the memory device incudes a memory array having a plurality of memory cells, a control unit operatively coupled to the memory array, a biasing stage controllable by the control unit and configured to apply a biasing configuration to the memory cells to perform a memory operation and a reading stage coupled to the memory array and controllable by the control unit in order to verify whether the memory operation has been successful based on a verify level, the method comprising:

dynamically modifying a value of the verify level based on an ageing of the memory cells.

13. The method according to claim 12, further comprising verifying whether the memory operation has been successful using the dynamically adapted verify level.

14. The method according to claim 12, further comprising dynamically modifying the value of the verify level based on ageing information that are indicative of the ageing of the memory cells.

15. The method according to claim 14, further comprising retrieving the ageing information associated with ageing of the memory device from a configuration memory.

16. The method according to claim 15, further comprising determining the adaptively modified value of the verify level using a look-up table, wherein values of the verify level are stored in association with respective values for the ageing information.

17. The method according to claim 15, further comprising determining the adaptively modified value of the verify level using a function to compute the verify level based on the ageing information.

18. The method according to claim 17, wherein the ageing information is associated with the biasing configuration provided by the biasing stage that has allowed to successfully perform one or more previous memory operations.

19. The method according to claim 18, wherein the ageing information comprise a voltage biasing level required to erase a group of memory cells in one or more previous memory operations, the previous memory operations being erase operations.

20. The method according to claim 12, wherein the verify level includes one or both of an erase verify level to verify an erase memory operation and a programming verify level to verify a programming memory operation.

* * * * *